United States Patent [19]

Tavana

[11] Patent Number: 5,635,851
[45] Date of Patent: Jun. 3, 1997

[54] READ AND WRITABLE DATA BUS PARTICULARLY FOR PROGRAMMABLE LOGIC DEVICES

[75] Inventor: Danesh Tavana, Mountain View, Calif.

[73] Assignee: Xilinx, Inc., San Jose, Calif.

[21] Appl. No.: 595,608

[22] Filed: Feb. 2, 1996

[51] Int. Cl.$^6$ .................................................. H03K 19/177
[52] U.S. Cl. .................................. 326/27; 326/41; 326/86
[58] Field of Search .......................... 326/21, 26, 27–28, 326/83, 86, 41, 44; 327/380, 384

[56] References Cited

U.S. PATENT DOCUMENTS

| | | | |
|---|---|---|---|
| 5,073,730 | 12/1991 | Hoffman | 326/86 |
| 5,099,148 | 3/1992 | McClure et al. | 326/86 |
| 5,229,657 | 7/1993 | Rackley | 326/27 |
| 5,241,221 | 8/1993 | Fletcher et al. | 326/27 |
| 5,483,177 | 1/1996 | Van Lieverloo | 326/27 |

*Primary Examiner*—David R. Hudspeth
*Attorney, Agent, or Firm*—Mark A. Haynes, Esq.; Jeanette S. Harms, Esq.

[57] ABSTRACT

A data bus on an integrated circuit includes a series of selectors arranged in a ring, each selector having an output terminal, an enable terminal, a ring input terminal, and a data input terminal. The ring input terminal receives data from another selector in the ring. The data input terminal receives data from a data source. The output terminal supplies data to the ring input terminal of a next selector in the ring. The enable terminal receives enable signals from a data source. A selector either propagates the signal on its ring input terminal or a data signal on its data input terminal to the next selector.

17 Claims, 5 Drawing Sheets

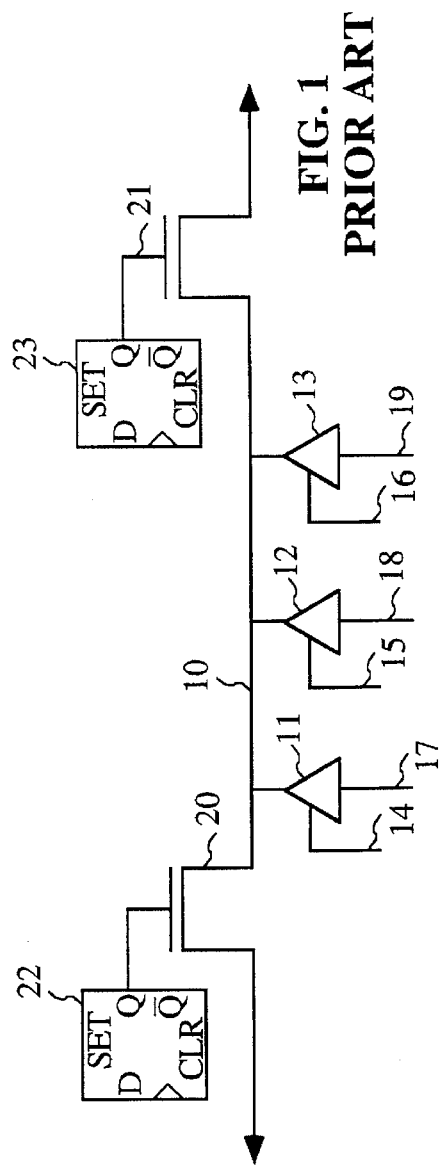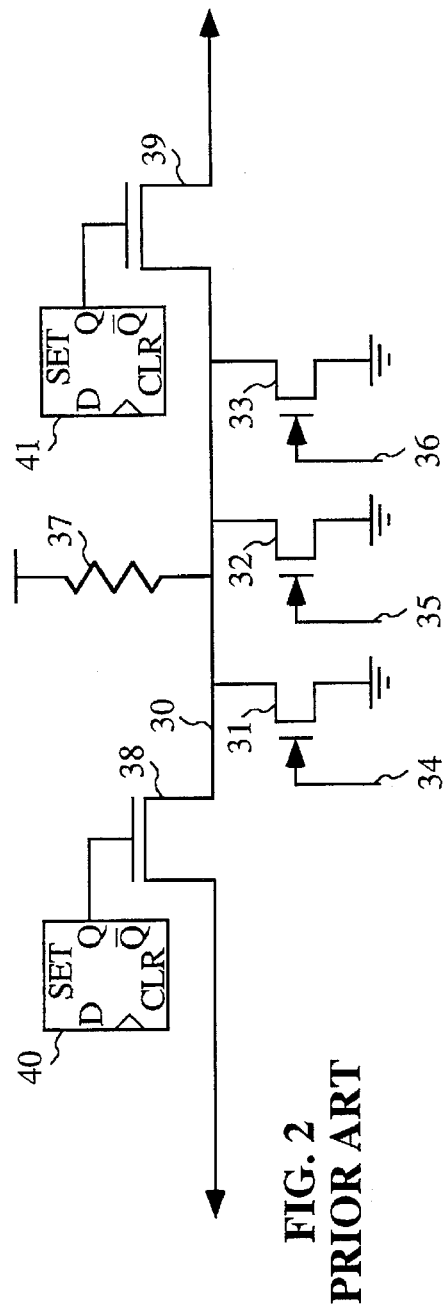

READ AND WRITABLE DATA BUS PARTICULARLY FOR PROGRAMMABLE LOGIC DEVICES

BACKGROUND OF THE INVENTION

1. Field of the Invention

The present invention relates to the implementation of read and writable data buses on integrated circuits; and more particularly to the implementation of programmable interconnect structures on programmable logic devices including long line read and writable data buses.

2. Description of Related Art

Field programmable gate arrays (FPGAs) comprise an integrated collection of logic blocks, programmably interconnected through a routing matrix. These blocks typically include registers, logic elements such as SRAM based look-up tables or a sea of gates, and tristate buffers for applying output data to buses. The user programs the logic block configuration and the routing matrix to produce a desired function.

The prior art FIG. 1 illustrates a typical data bus interconnect structure used in an FPGA. In FIG. 1, the data bus structure includes a conductor 10 driven by a set of tristate buffers 11, 12, 13, which have respective enable input lines 14, 15, 16, and respective data input lines 17, 18, 19. The gates of the segmentation transistors 20 and 21 are controlled by configurable storage elements 22 and 23, respectively. The conductor 10 is programmably expanded into larger sizes by turning on the segmentation transistors 20 and 21 (via the configurable storage elements 22 or 23). This prior art approach has a few shortcomings, including, for example, when several tristate buffers are enabled (turned on) simultaneously, a severe power consumption occurs on the device.

In the prior art tristate buffer configuration shown in FIG. 1, the longer the signal path down a long line, the more complicated it is to predict the delay associated with that signal. The prediction is complicated because the long line behaves like a transmission line with capacitive loading. The number of capacitors and the length of the line affect the delay of the signal on the line by a complex non-linear formula. Thus, early stage design tools for FPGA devices, must rely on relatively complicated techniques for managing the routing signals where long lines are involved.

FIG. 2 illustrates an alternative circuit for data bussing applications according to the prior art, which is also used in FPGAs. In the implementation of FIG. 2, a segment 30 of the interconnect structure is driven by a set of n-channel transistors 31, 32, 33. The gates of the n-channel transistors 31, 32, 33 receive the data input signals 34, 35, 36, respectively. If at least one input signal is high, the associated n-channel transistor turns on and pulls the signal on the segment 30 to ground. A passive pull-up device 37 is also coupled to the segment 30 to provide a logic high condition to the segment 30 when all transistors 31, 32, 33 are turned off. This passive pull-up device 37 may be a resistor (as shown), or a transistor biased in a conductive condition. Segmentation transistors 38 and 39 which are enabled by configurable storage elements 40 and 41 are also connected in the interconnect structure, in a similar manner to that of FIG. 1. This circuit does not suffer the unpredictability problem that exists with the system of FIG. 1, because of the current limiting effect of the pull-up device 37. However, there is a steady DC current consumed through the pull-up device 37. The approach of FIG. 2 also suffers the disadvantage of rapid degradation of the signal in a non-linear fashion as more bus segments are concatenated through the interconnect transistors 38 and 39. Furthermore, in order to pull up the conductor 30 with a reasonable performance, the pull-up device 37 must be sufficiently low in impedance. However, since the DC current on the segment increases with a lower impedance pull up, electromigration issues have to be considered when laying out the conductor used for the bus.

Accordingly, a need arises for a read and writable data bus structure, suitable for implementation of FPGA's and on other integrated circuit devices, which is fast, provides predictable delays, minimizes power consumption, is contention-free, and is programmably segmented into smaller buses.

SUMMARY OF THE INVENTION

The present invention provides a data bus on an integrated circuit which overcomes many of the problems of the prior art. The invention can be characterized as a series of selectors arranged in a daisy chain and having a programmable feedback path. Thus, the invention comprises a plurality of selectors arranged in a ring, wherein each selectors has an output terminal, an enable terminal, a ring input terminal, and a data input terminal. The ring input terminal receives a signal from a previous selector in the ring (via the output terminal of the previous selector). The data input terminal receives a signal from a data source. The enable input terminal also receives a signal from the data source, thereby allowing selectors to propagate a data value on the ring from the ring input terminal of the corresponding selector, or to write a data value on the ring from the data input terminal of the corresponding selector. A feedback path transfers an output signal of the last selector to a ring input terminal of the first selector, thereby establishing a logical ring. The selector may comprise passive multiplexers, in which case, the bus includes a data line driver. Alternatively, the selectors may comprise logic gates with or without data line drivers.

According to one aspect of the invention, the plurality of selectors includes a first set of selectors and a second set of selectors. The data bus includes a programmable segmentation circuit between the first and second sets of selectors, having a segmented state and an unsegmented state. In the segmented state, the output terminal of the last selector in the first set is connected to the ring input terminal of the first selector in the first set, and the output terminal of the last selector in the second set is connected to the ring input terminal of the first selector in the second set. In the unsegmented state, the output terminal of the last selector in the first set is connected to the ring input terminal of a first selector in the second set. Also, the output terminal of the last selector in the second set is connected to the ring input terminal of the first selector in the first set. The programmable segmentation circuit includes a storage element to store a program code that specifies either the segmented or unsegmented state. This storage element comprises a programmable storage element, such as, for example, a SRAM cell, an EPROM cell, a fuse, or an anti-fuse.

According to another aspect of the invention, the selectors in the plurality of selectors along the bus are arranged to propagate data in one direction across the integrated circuit. The data bus, according to this aspect, includes a feedback path which connects the output terminal of an ending selector in the plurality to the ring input terminal of a beginning selector in the ring. A programmable segmentation circuit can be added to this implementation, in which the feedback path is utilized to form the connections between the selectors as described above.

According to yet another aspect of the invention, the data bus is utilized as a bus structure on a field-programmable gate array, or other programmable logic devices. In this aspect, the data sources arise from the programmable logic cells on the integrated circuit. The programmable logic device may include a large number of potential sources of data.

Accordingly, a unique data bus structure has been provided, suitable for use in programmable logic devices. The data bus structure is fast, has predictable delays, and does not consume static power. Furthermore, the data bus structure in accordance with the present invention does not suffer from power surges when more than one data source attempts overlapping access to the bus. Furthermore, the data bus structure is programmably segmentable to a set of smaller buses.

Other aspects and advantages of the present invention can be seen upon review of the figures, the detailed description and the claims which follow.

BRIEF DESCRIPTION OF THE FIGURES

FIG. 1 is a schematic diagram of a prior art data bus.

FIG. 2 is a schematic diagram of an alternative prior art data bus.

DETAILED DESCRIPTION OF THE FIGURES

Figure 3:
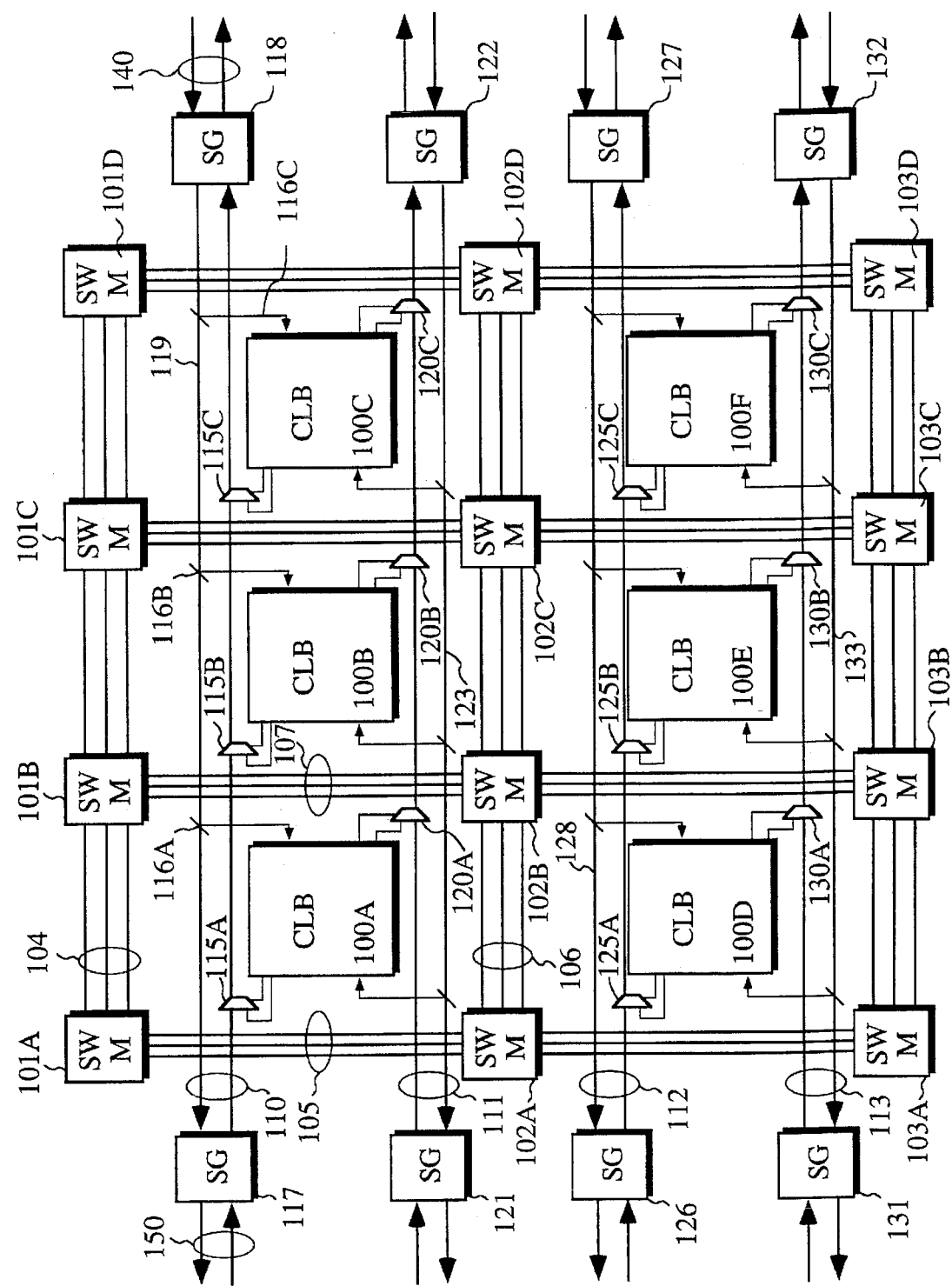
FIG. 3 illustrates a field programmable gate array device incorporating read and writable data buses of the present invention.

FIG. 3 illustrates a portion of an FPGA incorporating the read and writable data bus of the present invention. In FIG. 3, a plurality of configurable logic blocks 100-A through 100-F are surrounded by an interconnect structure including switch matrices 101-A, 101-B, 101-C, 101-D, 102-A, 102-B, 102-C, 102-D, 103-A, 103-B, 103-C, and 103-D. Note that in this embodiment, a switch matrix is positioned on all corners of a configurable logic block. Interconnect lines 104, 105, 106, and 107 interconnect the switch matrices 101-A, 102-A, 102-B, and 101-B. Other interconnect lines interconnect other switch matrices. Programmable interconnect points for providing connections between input or output terminals of the configurable logic blocks and the interconnect lines 104, 105, 106, 107, through which signals may be routed among the configurable logic blocks, are not shown for simplicity.

FIG. 3 illustrates one implementation of a programmable device incorporating the present invention, having an architecture, such as that of the XC4000 family of devices available from Xilinx, Inc. of San Jose, Calif. The interconnect resources, according to the XC4000 architecture, typically include general purpose, single length, and double length lines which offer fast routing between adjacent blocks and the highest flexibility for complex routing. However, these interconnect resources incur a delay every time they pass through a switch matrix. In one embodiment, the read and writable data buses are implemented according to the present invention, thereby providing data buses running the width or height of the chip with negligible delay variations.

FIG. 3 illustrates a plurality of data buses 110, 111, 112, and 113 of which data bus 110 includes multiplexers 115A, 115B, and 115C. One input terminal (referenced herein as the ring input terminal) of each of the multiplexers 115 is connected to the output terminal of the previous multiplexer, wherein the other input terminal (referenced herein as the data input terminal) is connected to a driver (not shown) within the configurable logic block. Note that the select control input terminal (also referenced as the enable terminal) of the multiplexer is also driven by the configurable logic block in this embodiment. The data bus 110 is coupled to segmentation circuits 117 and 118, wherein the segmentation circuit 118 selectively connects the output terminal of the multiplexer 115C to a feedback path 119 (a segmented state) or to another data bus 140 (a non-segmented state), and segmentation circuit 117 selectively connects the feedback path 119 to the ring input terminal of the multiplexer 115A (the segmented state) or to another data bus 150 (the non-segmented state). The segmented and non-segmented states of the data bus of the present invention will be described in further detail in reference to FIGS. 4 and 5. The configurable logic blocks 100A–100C sample data on the data bus 110 via programmable interconnect points and the lines 116A, 116B, 116C, respectively. Programmable interconnect points are well known in the art and are implemented using a variety of technologies including, for example, EPROM or SRAM controlled pass transistors, fuses, and antifuses.

As shown in FIG. 3, there are a number of data buses of similar configuration. Specifically, the data bus 111 includes multiplexers 120A–120C, feedback conductor 123, and segmentation circuits 121 and 122; the data bus 112 includes multiplexers 125A–125C, feedback conductor 128, and segmentation circuits 126 and 127; and the data bus 113 includes multiplexers 130A–130C, feedback conductor 133 and segmentation circuits 131 and 132. Note that the data buses can be arranged vertically, horizontally, diagonally, or along any path on the chip as suits the needs of the particular implementation. Moreover, although FIG. 3 shows three multiplexers for each data bus, other embodiments include different numbers of multiplexers. Finally, data buses of the present invention, although particularly suitable for programmable logic devices, can be utilized in a variety of other integrated circuit environments.

Figure 4:
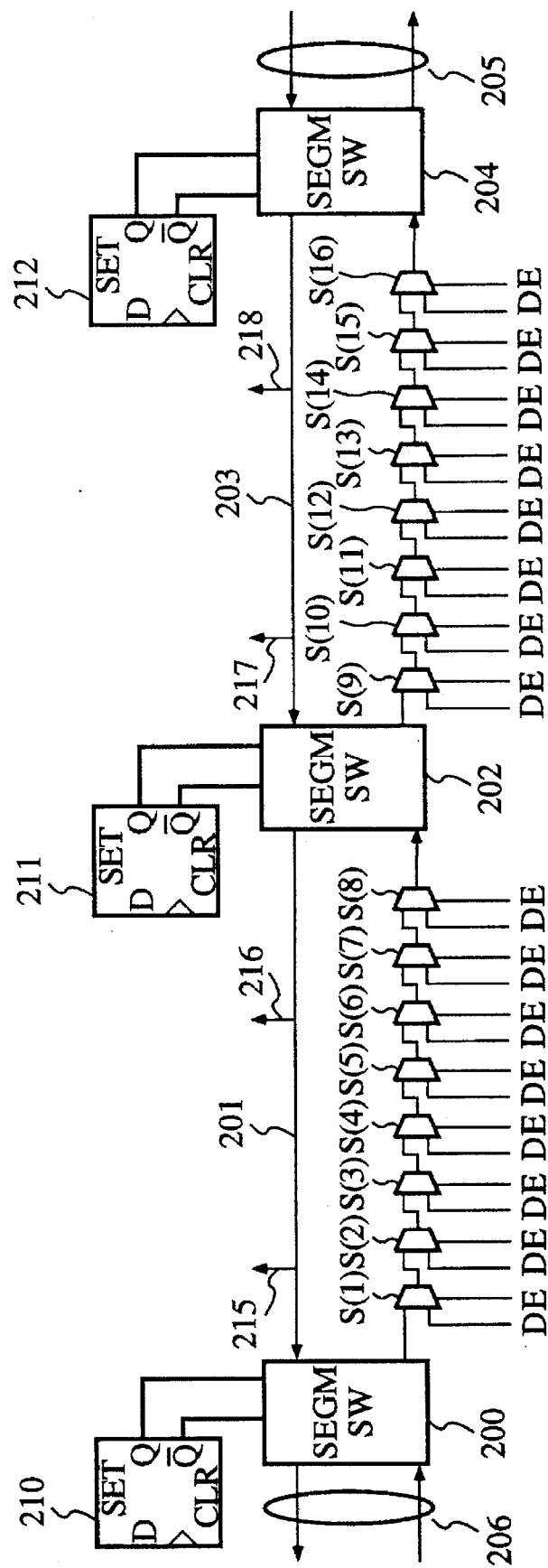
FIG. 4 is a schematic diagram of the read and writable data bus of the present invention.

FIG. 4 illustrates a more detailed implementation of a data bus according to the present invention. In FIG. 4, a data bus is implemented using a plurality of 2 to 1 selectors. The data bus includes a first set of selectors S(1) through S(8) and a second set of selectors S(9) through S(16). Each of the selectors includes an output terminal, a ring input terminal, a data input terminal receiving a data signal D, and an enable terminal receiving an enable signal E. The ring input terminal of each selector is connected to receive a signal from the output terminal of another selector. Thus, the selectors are connected in a daisy chain fashion. Although FIG. 4 shows selectors in the feed forward path in the chain, in alternative embodiments, selectors are used in the feedback path.

The signal on the ring input terminal for selector S(1) is provided by a segmentation switch 200. The segmentation switch 200 receives signals in part from segmentation switch 202 via a feedback path 201. The output terminal of the last selector S(8) in the first selector set is connected to an input terminal of the segmentation switch 202. Segmentation switch 202 also drives the ring input terminal of the first selector S(9) in the second selector set. A feedback path 203 provides the other input signals to the segmentation switch 202. The feedback path 203 is connected to the segmentation switch 204, which also receives as input signals the output signals of the last selector S(16) in the second selector set. Additional selector sets are connected to the data buses 205 and 206. As described in detail below, this structure may be cascaded along a device to provide a segmentable data bus on the integrated circuit.

The segmentation switches 200, 202, and 204 are programmable to provide a segmented state and an unsegmented state, depending on the values stored in the programmable storage elements 210, 211, and 212, respectively. In one embodiment, these storage elements include SRAM elements. However, in other embodiments, the storage elements are implemented with any programable device, such as a fuse, an anti-fuse, or a floating gate transistor.

In a segmented state, the segmentation switch 202 connects the output terminal of the last selector S(8) in the first selector set, to the feedback path 201. In one embodiment, the segmentation switch 200 connects the feedback path 201 to the ring input terminal of selector S(1) in the first selector set, thereby limiting the length of the data bus to the first set of selectors S(1)–S(8). In the unsegmented state, the segmentation switch 202 connects the output terminal of the selector S(8) in the first selector set to the input terminal of the selector S(9) in the second selector set. In one embodiment, the feedback path 203 is coupled to the feedback path 201, thereby extending the data bus to the first and the second set of selectors S(1)–S(16). Thus, the state of segmentation switches 200 and 204, i.e. segmented or unsegmented, determines the length of the data bus and the number of selectors for a particular implementation.

In accordance with the present invention, a maximum of one selector is enabled to provide a data input signal D. In this manner, the value provided at the output of the ring will be equal to the data supplied at the associated selector. For example, assume a hypothetical data value X is selected by selector S(2). The next selector S(3), which is programmed to pass the signal on its ring input terminal, propagates the output signal of selector S(2) to the input terminal of selector S(4). Because selector S(4) is programmed in a similar manner, it propagates the output signal of selector S(3) to the input terminal of selector S(4) and so on, down the chain. Assuming a segmented state, segmentation switch 202 provides the output signal of selector S(8) to the input ring terminal of selector S(1) via the feedback path 201. Thus, selector S(1) receives the data value X provided to the ring via selector S(2). As indicated by the arrows 215–218 on the feedback paths 201 and 203, data may be read from the bus anywhere along the chain, preferably by connections to the feedback path. In other embodiments, data is sampled at other locations in the bus structure, such as at the output terminals of the selectors S.

Figure 5:
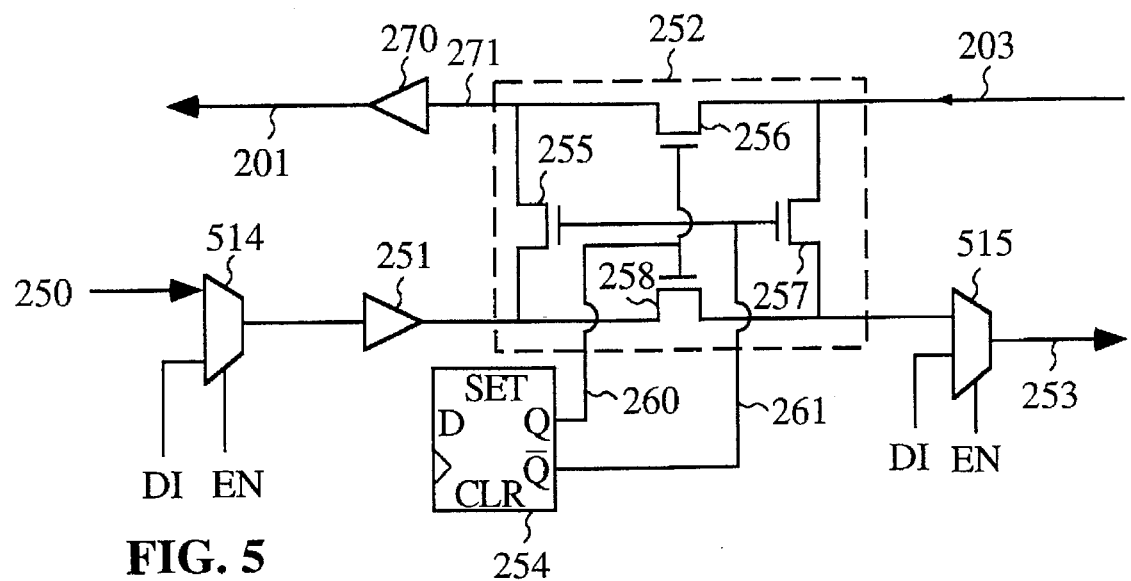
FIG. 5 illustrates the programmable segmentation circuit according to one embodiment of the present invention.

FIG. 5 illustrates one embodiment of a programmable segmentation switch 252 controlled by a programmable storage cell 254. FIG. 5 further shows a last selector 514 from a previous selector set (not shown). Selector 514 has a ring input terminal receiving an input signal 250, a data input terminal receiving a data input signal DI, and an enable terminal receiving an enable signal input EN. The output signal of the selector 514 is provided as an input signal to a buffer 251. FIG. 5 also shows the first selector 515 in the next selector set (not shown) receiving a first input signal from segmentation switch 252, a data input signal DI, and an enable input signal EN. The output signal of the selector 515 is supplied on line 253 to the next selector (not shown) in the chain. The segmentation switch 252 is also connected to a feedback path 201, and to the feedback path 203.

In this embodiment, segmentation switch 252 includes four n-channel transistors 255, 256, 257, and 258. Transistor 258 is connected as a pass transistor between the output terminal of the buffer 251 and the ring input terminal of the selector 514; transistor 256 is connected as a pass transistor between a feedback path 203 and the feedback path 201; transistor 255 is connected as a pass transistor between the output terminal of the buffer 251 and the feedback path 201; and transistor 257 is implemented as a pass transistor between the input terminal of selector 514, and the feedback path 203. The gates of transistors 256 and 258 are connected to the "Q" output terminal of the programmable storage element 254 via line 260, whereas the gates of the transistors 255 and 257 are connected to the "Q" (bar) output terminal of the programmable storage element 254 via line 261.

If the programmable storage element 254 supplies a high output signal on line 260 and a low output signal on line 261, transistors 258 and 256 are conducting, and transistors 255 and 257 are non-conducting, thereby resulting in an unsegmented state for the segmentation switch 252. In this state, segmentation switch 252 connects the feedback path 203 to the feedback path 201, and connects the output terminal of the buffer 251 to the ring input terminal of the selector 515.

On the other hand, if the programmable storage element 254 supplies a low output signal on line 260 and a high output signal on line 261, transistors 255 and 257 are conducting, and transistors 256 and 258 are non-conducting, thereby resulting in a segmented state for the segmentation switch 252. In this state, segmentation switch 252 connects the output terminal of buffer 251 to the feedback path 201, and the feedback path 203 to the ring input terminal of the selector 515.

In one embodiment, the buffer 251 is positioned in the chain between the output terminal of the last selector in the set, and the input terminal of the segmentation switch to maintain the signal quality as the signal is passed through the chain. In this embodiment, a buffer 270 is also positioned in the chain between one output terminal of the segmentation switch and feedback path 201 to provide further signal improvement. As is well known in the art, buffers 251 and 270 are each implementable as a series of two inverters. Furthermore, the buffers can be distributed around the ring at the output terminal of every selector, or at the output terminal of every other selector, depending on the needs of the particular device. The buffer 251 is particularly advantageous if the selectors are implemented using passive structures, such as that shown in FIG. 6.

Figure 6:
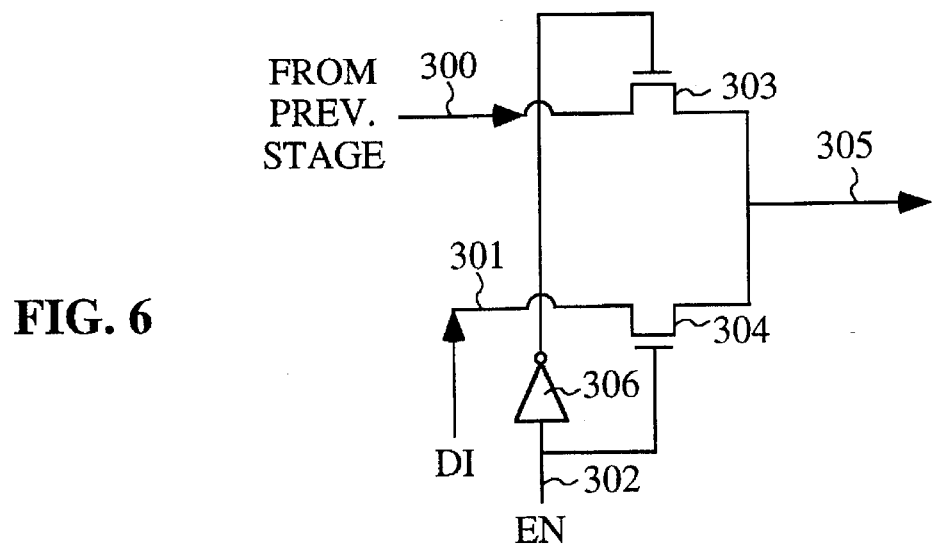
FIG. 6 illustrates a passive multiplexer circuit for the data bus of the present invention.

FIG. 6 illustrates a passive 2-to-1 selector (multiplexer) which includes a ring input terminal 300 receiving a signal from a previous stage in the bus, a data input terminal 301 which receives the signal DI, and an enable input terminal 302 which receives the enable signal EN. The selector includes a pass transistor 303 which connects the ring input terminal 300 to the output terminal 305, and a pass transistor 304 which connects the data input terminal 301 to the output terminal 305. The enable terminal input 302 is connected directly to the gate of transistor 304 and through an inverter 306 to the input terminal of transistor 303. Thus, depending on the value of the enable signal EN, either the signal on the ring input terminal 300 from a previous stage is supplied to the output terminal 305 (enable low), or the data signal DI from the data input terminal 301 is supplied to the output terminal 305 (enable high).

Figure 7:
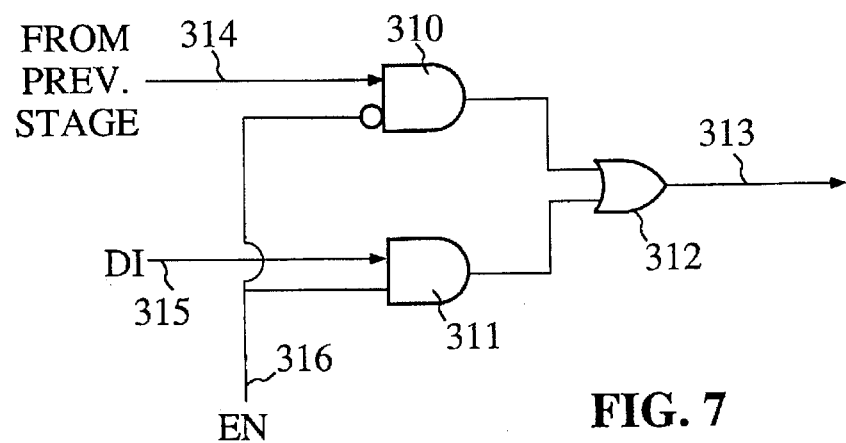
FIG. 7 illustrates the use of logic gates to provide the selector circuit for the data bus of the present invention.

FIG. 7 illustrates an alternative selector implementation using standard logic gates. The logic gates are designed with sufficient drive capability to maintain signal quality around the ring without relying on buffers, such as buffer 251 (FIG. 5). The logic gate implementation shown in FIG. 7 includes a first AND gate 310 and a second AND gate 311. Output signals of the AND gates 310 and 311 are provided as input signals to an OR gate 312. The output signal of the OR gate 312 is the output signal 313 of the selector. The input signals to the selector include the output signal of a previous stage at ring input terminal 314, the data input signal DI on data input terminal 315, and the enable signal EN on enable terminal 316. The signal on the ring input terminal 314 is supplied as an active high input to AND gate 310, while the enable signal EN on enable terminal 316 is supplied to an active low input of AND gate 310. The data input signal DI on data input terminal 315 is supplied as an active high input of AND gate 311, while the enable signal EN on enable terminal 316 is supplied as an active high input of AND gate 311. If the enable signal EN is low, the signal from the previous stage on the RING input terminal 314 is provided as the output signal 313. On the other hand, if the enable signal EN is high, the data input signal DI on data input terminal 315 is provided as the output signal 313, while the signal from the previous stage is blocked.

The read and writable data bus according to the present invention is suitable for implementation of long data buses on integrated circuits, having in the range of ten to hundreds or even more drivers along the single data bus. The bus can be segmented, as discussed above, to control propagation delays along the bus, and utilize buffers to maintain signal quality as needed.

Figure 8:
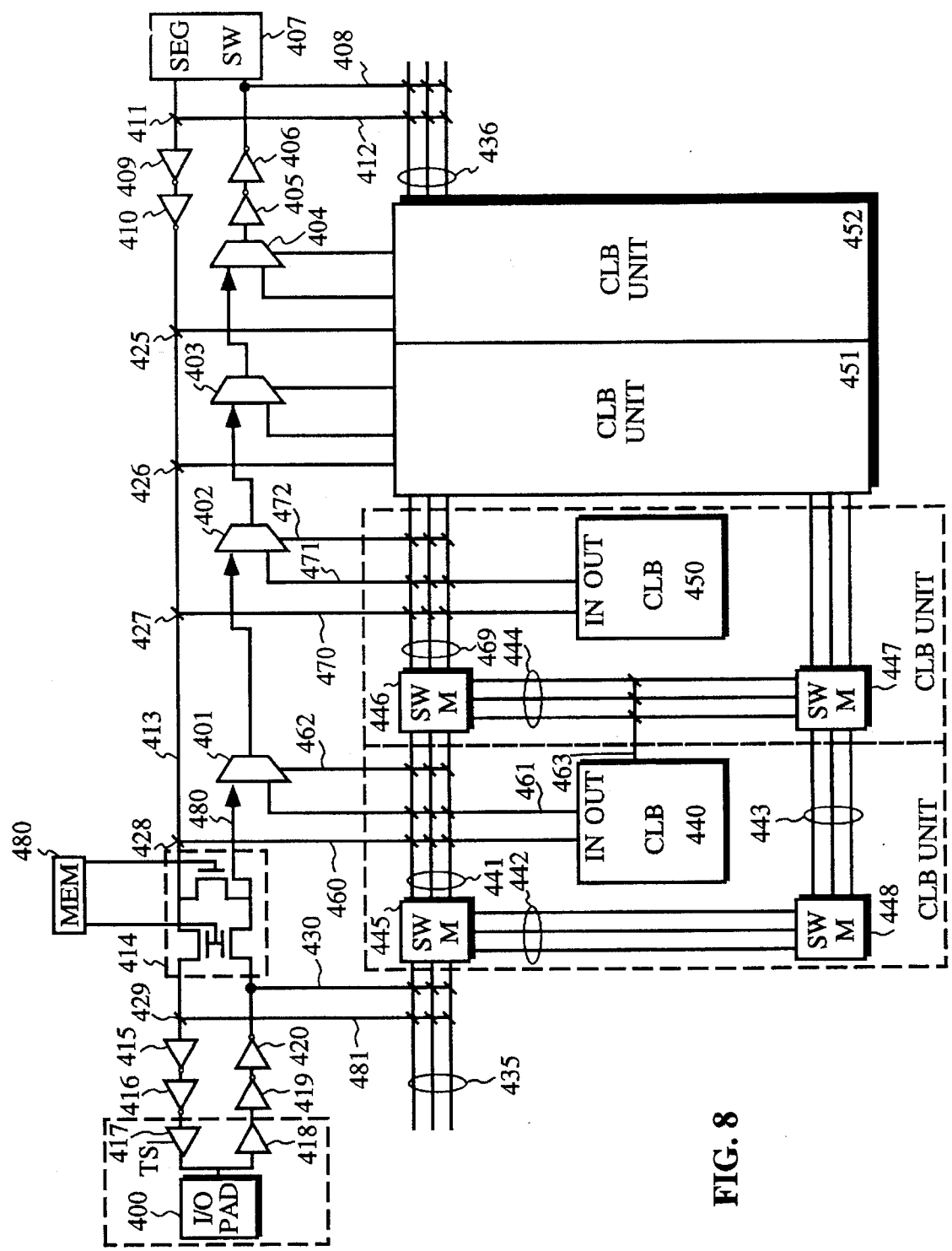
FIG. 8 shows further details of the bus of the present invention on an FPGA.

FIG. 8 illustrates further details of one implementation of the present invention in an FPGA environment. Specifically, a section of an FPGA includes one segment of a data bus according to the present invention coupled to an input/output pad 400. The bus segment includes multiplexers 401, 402, 403, and 404. A buffer, consisting of inverters 405 and 406, is connected to the output terminal of multiplexer 404. The output terminal of the inverter 406 is connected to a segmentation switch 407 and an interconnect line 408. The feedback path 413 of the data BUS includes inverters 409 and 410, which act as a buffer for receiving the output signal of the segmentation circuit 407. At the input terminal of the inverter 409, a programmable interconnect point 411 programmably connects line 412 to the feedback path 413. The output terminal of the inverter 410 drives the feedback path 413 which connects to data line termination switch 414. The termination switch 414 is similar to the segmentation switch 252 of FIG. 5 described above, except that termination switch 414 has only three transistors. The output terminal of the termination switch 414 is connected to the input terminal of a buffer comprising inverters 415 and 416. The output terminal of the inverter 416 drives a tristate buffer 417 which has its output terminal connected to the I/O pad 400. An input buffer 418 receives a signal from the I/O pad 400 and drives another buffer comprising inverters 419 and 420. The output terminal of the inverter 420 is connected to the termination switch 414 on the feed forward path 480 of the bus. When the segmentation switch 407 is programmed to the segmented state, the feedback path 413 is connected to the feed forward path 480 and the I/O pad 400 is disconnected from the bus.

Programmable interconnect points 425–428, through their respective data conductors, couple the feedback path 413 of the bus to the interconnect structure associated with the configurable logic blocks. For example, the programmable interconnect point (schematically illustrated by a slash) 427 and its associated conductor 470 provide a path for programmably providing the data on the feedback path 413 to one of a plurality of local interconnect lines 469. Input data from the I/O pad 400 can be programmably provided through the conductor 430 to the interconnect lines 435. Other examples in this embodiment include the feed forward path connected across conductor 408 to the interconnect lines 436, and the feedback path 413 connected across conductor 412 through the programmable interconnect point 411 to interconnect lines 436. Thus, the conductors 408, 412, 430, and 481 provide an access mechanism to the signal routing resources in the FPGA to flexibly connect the non-neighboring data bus segments and bypass the segmentation switches. The connections provided across the lines 408 and 412 are also useful for routing signals among segmented rings of the data bus, or from a ring segment to the interconnect structure so that the signals generated on the bus segment can be propagated throughout the device, without requiring extra segments of the bus to be used.

FIG. 8 further illustrates a configurable logic block (CLB) 440 and its interconnect structure, a CLB 450 and its interconnect structure, and CLB units 451 and 452 for use with their respective multiplexers 401–404 on the data bus. A CLB unit consists of a configurable logic block (such as CLB 440), interconnect lines (such as interconnect lines 441–443), and the switch matrices which provide resources for routing signals among the interconnect lines (such as switch matrices 445 and 448).

Connection from CLB 440 to its corresponding multiplexer 401 is illustrated in FIG. 8. For example, in one embodiment, an input signal from the bus to the CLB 440 is provided across conductor 460 from the programmable interconnect point 428 to the input port IN of the CLB 440 (via the programmable interconnect points on the interconnect lines 441). In this embodiment, an output signal from the CLB 440 (on output port OUT) is supplied on line 461 to the data input terminal of multiplexer 401 (also via the programmable interconnect points on the interconnnect lines 441). In another embodiment, programmable interconnect points on the interconnect lines 441 are coupled to line 461 so that alternative sources of data for the multiplexer 401 are available.

The enable signal for the multiplexer 401 is provided on line 462. Line 462 is coupled to the interconnect lines 441 through programmable interconnect points as shown in FIG. 8. Thus, the enable signal can be supplied through the interconnect routing of the CLB from a wide variety of sources. For example, in one embodiment the enable signal is provided on line 463 from an output terminal of the CLB 440, routed across the interconnect lines 444, passed through the switch matrix 446 onto the interconnect lines 441, and finally provided on line 462.

The CLB 450 is connected in a similar manner to the feed back path 413 via programmable interconnect points on interconnect lines 469 and line 470. The output signal of the CLB 450 is supplied on line 471 to the data input terminal of multiplexer 402. The enable signal for the multiplexer 402 is supplied on line 472 through programmable interconnect points on the interconnect lines 469. The CLB units 451 and 452 are similarly connected.

The daisy chain multiplexer technology provides a bus having a predictable delay for an FPGA device, i.e. the delay is based on the number of connected segments of the bus.

For example, if the bus is one segment long, then the delay of a signal is equal to the delay of one traverse of the ring. If the bus is two segments long, then the delay of each signal on the bus is equal to the delay of the traverse of the signal around two segments of the ring. In this manner, the present invention ensures a linear, readily predictable value which can be utilized by early stage design tools to ensure reliable layout of circuits by programmers of FPGAs.

Thus, the present invention provides an efficient bus structure, particularly suited for use on long lines in field programmable gate arrays, or in other programmable logic devices. The bus structure provides significant improvement over prior art approaches. Particularly, the bus is fast, has predictable delays, does not consume steady state power, and is contention free. Furthermore, the bus is readily segmented into smaller buses as suits the needs of a particular design.

The foregoing description of the present invention has been presented for purposes of illustration and description. It is not intended to be exhaustive or to limit the invention to the precise forms disclosed. Many modifications and variations will be apparent to practitioners skilled in this art. It is intended that the scope of the invention be defined by the following claims and their equivalents.

I claim:

1. A data bus on an integrated circuit, comprising:
    a plurality of selectors arranged in a ring, each selector having a control terminal, a ring input terminal, a data input terminal, and an output terminal, wherein the ring input terminal receives a signal from another selector in the ring, the data input terminal receives data from a data source, the output terminal supplies a signal to the ring input terminal of a next selector in the ring, and the control terminal receives an enable signal that determines whether a selector propagates the signal on the its ring input terminal or the data signal on its data input terminal.

2. The data bus of claim 1, wherein the plurality of selectors comprise passive multiplexers, and the data bus includes a data line driver connected to the output terminal of at least one selector.

3. The data bus of claim 1, wherein the plurality of selectors comprise logic gates.

4. The data bus of claim 1, wherein the plurality of selectors includes a first set of selectors and a second set of selectors, and the data bus includes a programmable segmentation circuit having:
    a segmented state in which the output terminal of a last selector in the first set is connected to the ring input terminal of a first selector in the first set, and the output terminal of a last selector in the second set is connected to the ring input terminal of a first selector in the second set, and
    an unsegmented state in which the output terminal of a last selector in the first set is connected to the ring input terminal of a first selector in the second set, and the output terminal of a last selector in the second set is connected to the ring input terminal of a first selector in the first set.

5. The data bus of claim 4, wherein the programmable segmentation circuit includes a storage element to store a program code specifying the segmented or unsegmented state.

6. The data bus of claim 5, wherein the storage element comprises a programmable device.

7. The data bus of claim 1, wherein the plurality of selectors is arranged to propagate data in a first direction across the integrated circuit, and the data bus includes a feedback path which selectively connects the output terminal of a last selector to the ring input terminal of a first selector.

8. The data bus of claim 7, wherein the plurality of selectors include a first set of selectors and a second set of selectors, the feedback path includes a first segment coupled to the ring input terminal of the first selector, and a second segment connected to the output terminal of the last selector, wherein the data bus includes a programmable segmentation circuit coupled between the output terminal of a last selector in the first set and the ring input terminal of a first selector in the second set,
    and coupled between the first and second segments, the programmable segmentation circuit having
        a segmented state in which the output terminal of the last selector in the first set is connected to the first segment, and the ring input terminal of the first selector in the second set is connected to the second segment, and
        an unsegmented state in which the output terminal of a last selector in the first set is connected to the ring input terminal of a first selector in the second set, and the first and second segments are connected.

9. A programmable logic device on an integrated circuit, comprising:
    a plurality of programmable logic cells having data output terminals and enable output terminals;
    a data bus including a plurality of sets of selectors arranged in a ring to provide a data bus readable and writable by the plurality of programmable logic cells, each selector in the plurality of sets of selectors having an output terminal, a control terminal, a ring input terminal, and a data input terminal, the ring input terminal connected to receive data from another selector in the ring, the data input terminal connected to the data output terminal of one programmable logic cells, the respective output terminal connected to supply data to the ring input terminals of a next selector in the ring, and the control terminal connected to the enable output terminal of one programmable logic cell, wherein signal on the control terminal determines whether the selector propagates a signal on the ring input terminal, or a data signal on the data input terminal; and
    a plurality of programmable segmentation circuits between adjacent pairs of sets of selectors in the plurality of sets, the programmable segmentation circuits having
        respective segmented states in which the output terminal of a last selector in a first set in said pair is connected to the ring input terminal of a first selector in the first set, and the output terminal of a last selector in a second set in said pair is connected to the ring input terminal of a first selector in the second set, and
        respective unsegmented states in which the output terminal of a last selector in the first set in said pair is connected to the ring input terminal of a first selector in the second set in said pair, and the output terminal of a last selector in the second set in said pair is connected to the ring input terminal of the first selector in the first set.

10. The programmable logic device of claim 9, wherein selectors in the plurality of sets of selectors comprise passive multiplexers, and the data bus includes a data line driver connected to the output of at least one selector in the plurality of selectors.

11. The programmable logic device of claim 9, wherein the plurality of sets of selectors comprise logic gates.

12. The programmable logic device of claim 9, wherein the programmable segmentation circuits include respective storage elements to store program codes specifying the segmented or unsegmented state.

13. The programmable logic device of claim 12, wherein the storage element comprises a programmable device.

14. The programmable logic device of claim 9, wherein the plurality of sets of selectors is arranged to propagate data in a first direction across the integrated circuit, and the data bus includes a feedback path which selectively connects the output terminal of an ending selector in the plurality to the ring input terminal of a beginning selector in the ring.

15. The programmable logic device of claim 14, wherein the feedback path includes a plurality of segments, corresponding to respective sets of selectors in the plurality of sets, connected to programmable segmentation circuits, and wherein the programmable segmentation circuits in the segmented state, connect the output terminal of a last selector in the first set of the pair to the segment of the feedback path corresponding to the first set, and connect the ring input terminal of the first selector in the second set to the segment of the feedback path corresponding to the second set, and in the unsegmented state, connect the output terminal of a last selector in the first set of the pair to the ring input terminal of a first selector in the second set of the pair, and connect the segments of the feedback path corresponding to the first and second sets together.

16. The programmable logic device of claim 9, wherein the programmable logic cells comprise configurable logic blocks.

17. The programmable logic device of claim 9, wherein the plurality of sets of selectors provide respective sections of the data bus, and the programmable logic device includes a programmable interconnect, and interconnect resources to connect at least one section of the data bus to the programmable interconnect independent of other sections of the data bus.

* * * * *